United States Patent [19]

Rote

[11] 4,083,323

[45] Apr. 11, 1978

[54] PNEUMATIC SYSTEM FOR SOLDER LEVELING APPARATUS

[75] Inventor: Everett Arthur Rote, Corona, Calif.

[73] Assignee: Xerox Corporation, Stamford, Conn.

[21] Appl. No.: 602,699

[22] Filed: Aug. 7, 1975

[51] Int. Cl.² .............................................. B05C 3/04
[52] U.S. Cl. ........................................ 118/6; 118/63; 118/425; 228/20
[58] Field of Search ................. 228/20, 180 R; 118/6, 118/63, 425, 56, 57

[56] References Cited

U.S. PATENT DOCUMENTS

| | | | |
|---|---|---|---|
| 2,803,216 | 8/1957 | Termini et al. | 118/56 X |
| 2,903,994 | 9/1959 | Hrubec | 118/6 |
| 3,431,887 | 3/1969 | Pettigrew et al. | 118/425 X |
| 3,661,638 | 5/1972 | Lemecha | 118/56 X |
| 3,795,358 | 3/1974 | Sarnacki et al. | 228/20 X |
| 3,865,298 | 2/1975 | Allen et al. | 228/20 |

*Primary Examiner*—Al Lawrence Smith
*Assistant Examiner*—K. J. Ramsey
*Attorney, Agent, or Firm*—James J. Ralabate; Allen S. Melser; Franklyn C. Weiss

[57] ABSTRACT

A solder levelling machine which uses a hot gas emanating from opposed gas knives to remove excess molten solder from a printed circuit board as the board is withdrawn from a bath of molten solder contained in a self-purging solder pot. The hot gas clears the through-holes in the circuit board and allows a controllable desired thickness of solder to remain on the board and in the through holes. A pair of heaters supplies the hot gas to the knives through a manifolding arrangement.

1 Claim, 9 Drawing Figures

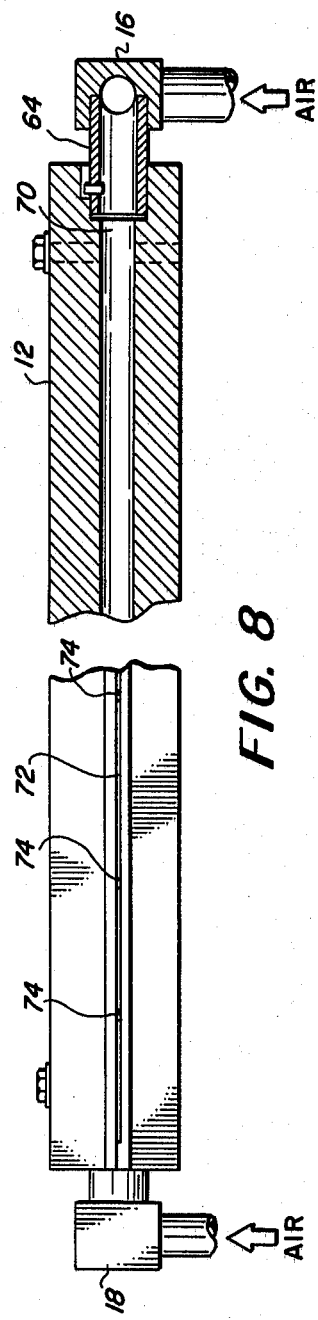
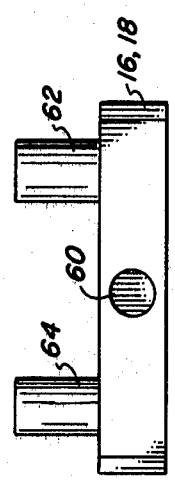
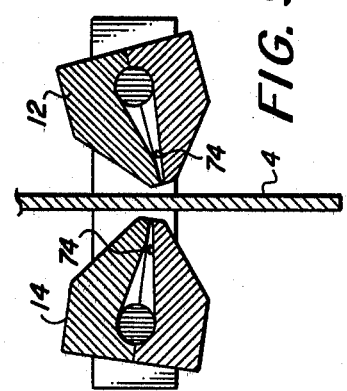
FIG. 7
FIG. 8
FIG. 9

PNEUMATIC SYSTEM FOR SOLDER LEVELING APPARATUS

BACKGROUND OF THE INVENTION

1. Field of the Invention

The instant invention relates to hot-gas solder levelling machines, and more particularly to a pneumatic system for controllably lowering a printed circuit board into a pool of molten solder, stroking the board upwardly and downwardly while immersed and subsequently raising the board out of the bath past a pair of knives from which a hot gas is directed upon the board to control the thickness of solder on the circuit conductors and the like of the board and to clear the through-holes of excess solder.

2. Description of the Prior Art

In the past, various techniques have been used to remove excess solder from printed circuit boards and to clear the through-holes of excess solder. One such prior art technique involved spraying or otherwise contacting the board with molten solder and subsequently immersing the board in a pool of hot wax or oil, vibrating the board to remove the excess solder and clear the holes and then withdrawing the board to cool. This technique had associated with it certain problems relating to pollution from fumes from the hot wax or oil and thermal shock to the boards which caused the printed circuits to lose continuity in some connections.

Another prior art technique involved immersing a board in molten solder and subsequently exposing the board to a blast of hot air or other gas. This technique has proved more effective than the hot wax or oil technique, but prior art machines for accomplishing the technique were generally slow and difficult to adjust for consistent and controllably variable solder deposition thicknesses.

SUMMARY OF THE INVENTION

The instant invention overcomes the problem of the prior art systems by providing a pneumatic arrangement for easily varying the rate of insertion and removal of the board from the molten solder and the length of insertion time within the solder. A pneumatic system in accordance with the invention comprises an air cylinder arrangement to insert and remove the board and a pulsing system for pulsing the board while immersed in molten solder at the bottom of the immersion stroke to agitate the board.

BRIEF DESCRIPTION OF THE DRAWINGS

FIGS. 4 and 5 are side and perspective views, respectively, of a solder pot and sump according to the invention.

FIG. 7 is a view of a manifold for the air knives of the invention.

FIGS. 8 and 9 are partially sectioned views of the air knives of the invention.

DETAILED DESCRIPTION OF THE PREFERRED EMBODIMENT

Figure 1:
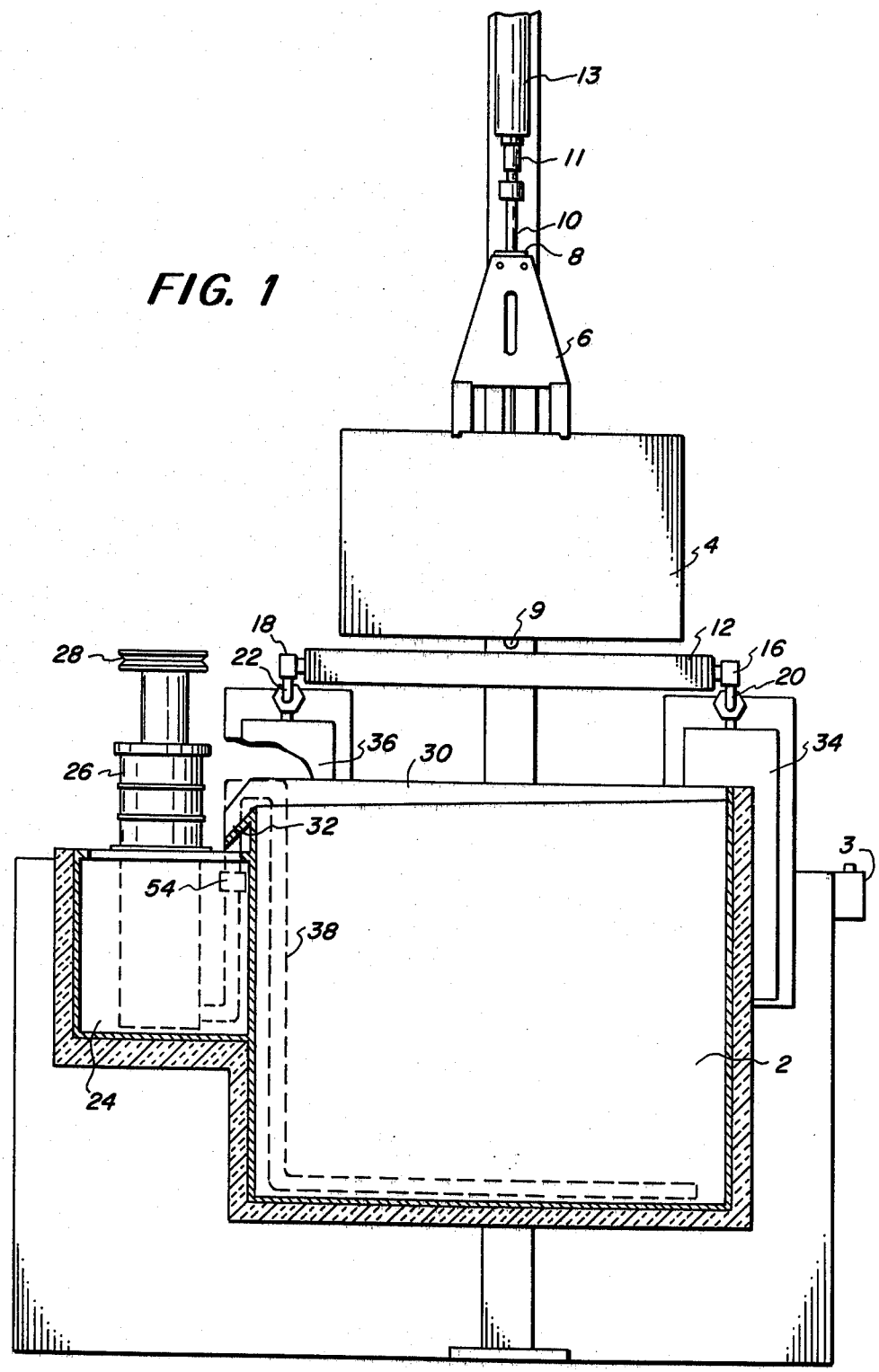
FIG. 1 is a front view of a solder leveling machine embodying features of the invention.

FIG. 1 shows a front view of a machine incorporating the features of the instant invention. It should be understood that the actual machine would be preferably enclosed in a heat-retaining protective cabinet, which is not illustrated for purposes of clarity.

A solder pot 2 is shown into which a printed circuit board 4 is to be lowered. The printed circuit board is secured by a fixture 6 which is clamped to a movable member 8 which moves along a guide rod 10 to lower the board into the solder pot 2. An air knife 12 is shown, the air knife being one of a pair of air knives, in front of and behind the path of the printed circuit board 4.

Also shown in FIG. 1 is a hand-operated switch 3 for operating the machine. Obviously other switches, such as automatic switches or foot switches may be used. The connection and function of the switch will be described in connection with the description of the operation of the pneumatic system of the machine.

Figure 2:
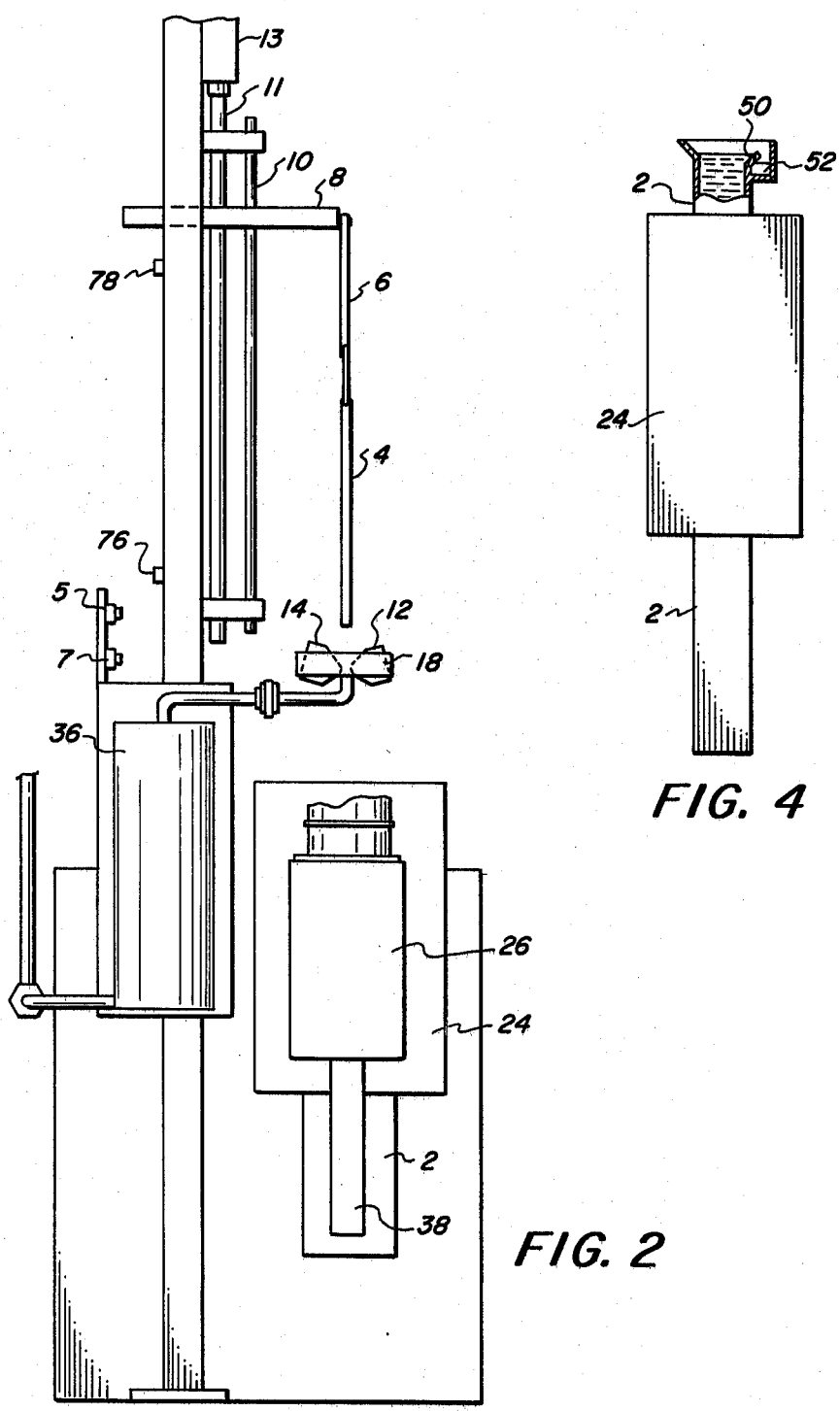
FIG. 2 is a side view of the machine of FIG. 1.

FIG. 2 shows a side view of the machine of FIG. 1 with like parts having like numbers. The rear air knife 14 is observable in FIG. 2. Further shown in FIG. 2 is another rod 11 attached to the piston of an air cylinder 13 upon which the movable member 8 travels in lowering the board into the solder pot. Movable member 8 extends through the support to the rear of the support through a slot 9 only the bottom of which is visible in FIG. 1.

At each end of the air knives is a manifold 16 and 18, each manifold being connected to a source of hot air or other gas under pressure 20 and 22.

To the immediate left of the solder pot is a solder reservoir 24 into which extends a submersible pump 26. The pump is driven by a pulley 28 by means of a motor mechanism not shown. Associated with the solder pot is a spillway 30 which openly communicates with the solder reservoir at 32. Partially hidden in FIG. 1 behind the solder pot 2 are a pair of heaters 34 and 36, each of the heaters having an outlet through the pipes 20 and 22 connecting the air or gas heater to the air knife manifolds 16 and 18.

Shown in FIG. 2, is a conduit 38 through which solder in the reservoir 24 may be pumped by the pump 26 into the solder pot 2.

A plurality of heaters, which may be strip heaters bolted to the sides of the reservoir or pump 24 and solder pot 2, are not illustrated for purposes of clarity.

Also shown in FIG. 2 are air switches 5, 7, on a suitable mounting bracket, the operation and function of which will be explained in connection with the description of the operation of the pneumatic system of the machine which follows.

Figure 3:
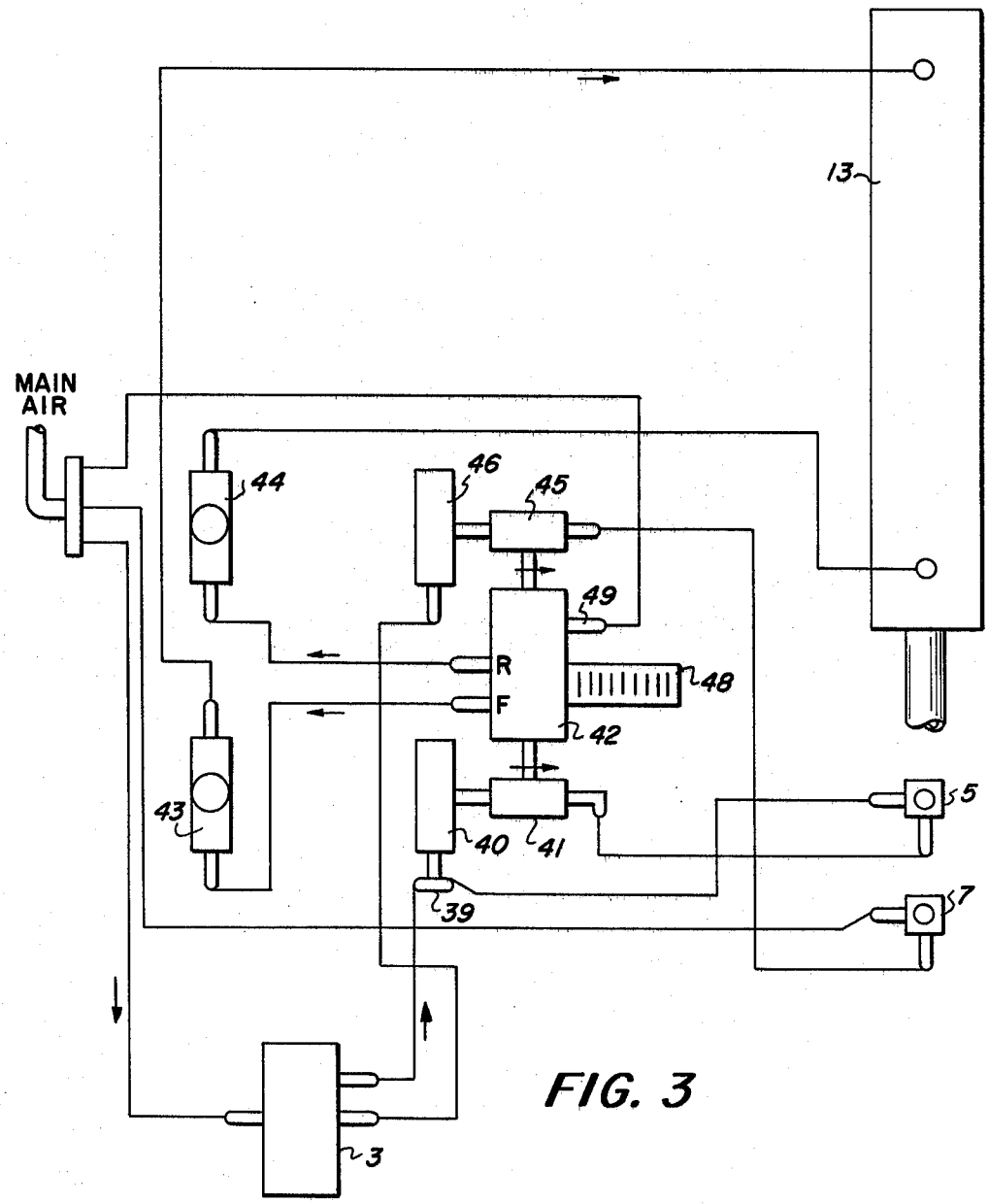
FIG. 3 is a schematic diagram of a pneumatic system usable with the machine of FIG. 1.

FIG. 3 is a schematic diagram of a pneumatic board raising and lowering system showing the appropriate controls and valves to cause the movable member 8 of FIGS. 1 and 2 to lower the printed circuit board 4 into the solder pot 2. While the board is immersed within the solder which is kept at a level at the top of the solder pot, the pneumatic mechanism may pulse the board rapidly up and down over a relatively short stroke to agitate the board while immersed within the molten solder of the solder pot 2.

The hand valve 3 is shown having a connection to a main supply of air. The hand valve 3 has an output connected by a line to a Tee connection 39. Tee 39 is in turn connected to a pulse valve 40 and the upper air switch 5, shown in FIG. 2. The air switch 5 is connected to one side of shuttle valve 41, the other side of which is connected to pulse valve 40. The outlet of shuttle valve 41 is connected to a master valve 42. Master valve 42 is connected to the main air supply source at 49 and has two outlets, one directed to flow control valve 43 and the other to flow control valve 44. The outlet of flow control valve 43 is connected to the top of air cylinder 13, and thus is the flow control valve which controls the rate of descent of the printed circuit board into the solder pot. The output of flow control valve 44 is connected to the bottom of air cylinder 13 and controls the rate of withdrawal of the board from the solder pot.

A second air switch 7 is connected to the main air source and also to a second shuttle valve 45. Shuttle valve 45 is connected to master valve 42 and to a pulse valve 46 which in turn is connected to a second outlet of hand switch 3. Master valve 42 has an exhaust mechanism 48, a part of the valve which acts to release air pressure applied to the piston of air cylinder 13 upon reversals of applied pressure to the piston.

Before the hand valve 3 is operated, no air except the main air supply source at 49 enters the master valve. This set of circumstances causes the master valve to direct the main air at 49 to the bottom of the piston of air cylinder 13 via the flow regulator 44 to withdraw the board from the solder pot.

The shuttle valves 41 and 45 normally prevent flow from pulse valves 40 and 46 to master valve 42. When hand valve 3 is operated, a flow of air from the main air supply and through valve 3 is applied to pulse valves 40 and 46 and, through Tee 39 to air switch 5. The application of air to pulse valve 40 opens shuttle valve 41 such that air flows from pulse valve 40 into master valve 42. Master valve 42 directs the main air supply source to flow regulator 43 which, in turn, applies air pressure to the top of air cylinder 13 causing the piston therein to begin a downstroke lowering the printed circuit board into the solder pot.

As the piston descends, and carries movable member 8 downwardly, member 8 strikes air switch 7. When switch 7 is tripped, the main air supply is momentarily connected, through switch 7 to shuttle valve 45 which operates to allow the source air switch to flow to master valve 42 and thereby cause it to change state. Master valve 42 exhausts the air pressure to the top of cylinder 13 and applies an air flow from the source supply to flow regulator 44 which applies air pressure to the bottom of the piston of air cylinder 13 to start the piston upward. Flow regulator 44 regulates the rate of withdrawal of the board from the solder pot to aid in controlling thickness of deposition of solder.

In this case, since hand valve 3 is still being held down, the board is not withdrawn but the up-stroke is stopped by the tripping of air switch 5. The tripping of air switch 5 allows source air pressure from Tee 39 to be applied momentarily to shuttle valve 41 which reverses its position and allows the flow of source air to master valve 42 again changing the state of that valve. Again, cylinder air pressure is exhausted and air flow is applied from the main air supply through regulator 43 to the top of the piston of cylinder 13 as in the initiation of operation.

The ensuring down stroke again trips switch 7 starting another up stroke. When switch 7 is tripped the momentary application of source air from switch 7 reverses master valve 42 as before. It may be noted that at all times during which hand switch 3 is depressed pulse valves 40 and 46 tend to bias the shuttle valves in the direction indicated by the arrows associated therewith.

The pulsing action continues as previously described until hand valve 3 is released. On the next upstroke following release of valve 3, switch 5 can no longer reverse the master valve 42 since its source of air passes through valve 3. The upstroke continues past switch 5 until the uppermost or home position is reached. The cycle may be repeated by again depressing hand valve 3.

During the pulsing action the stroke is limited, as previously noted, such that the printed circuit board does not emerge from the molten solder. The stroking then serves the purpose of agitating the solder pool and helping to control the thickness of solder coating on the board.

Figure 5:
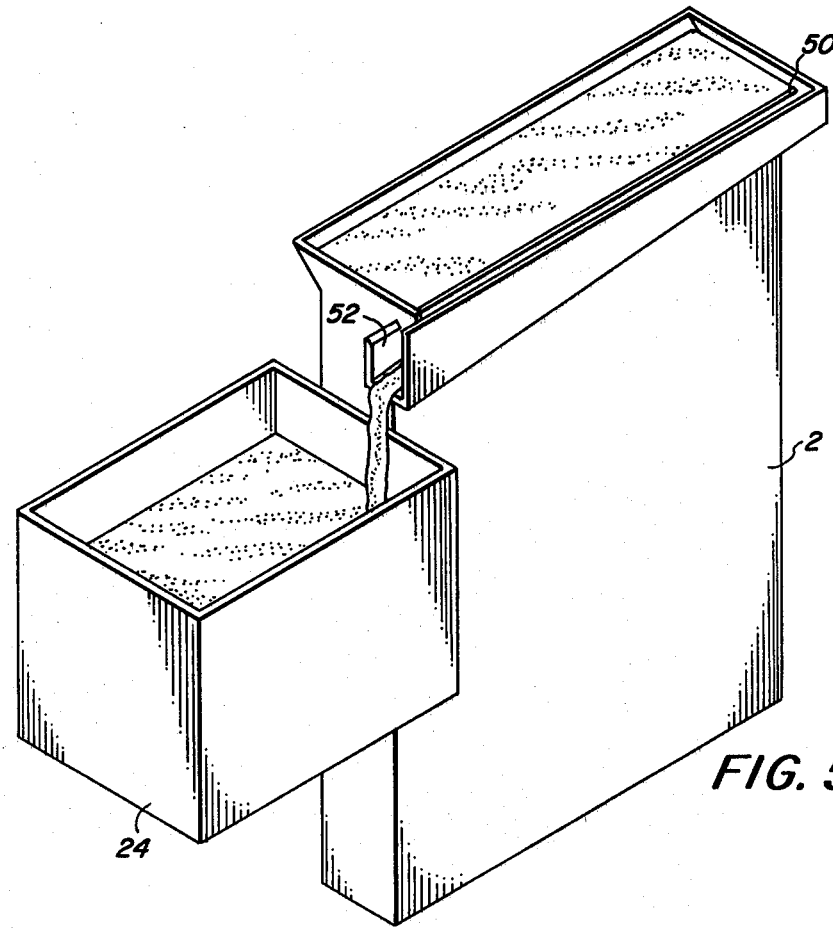

FIG. 4 is a side view of the solder pot 2 and solder sump 24 and FIG. 5 is a perspective view of the same elements. The pump 26 is not shown in either of the figures so that other details of the structure are visible.

For purposes of illustration, the solder pot of the instant invention may have an internal width of approximately two inches, a height of approximately 24 inches, and a length of approximately 28 inches. The solder sump 24 may have a width of approximately six and one-half inches, a height of approximately twelve and three-quarter inches and a depth of approximately twelve and three-quarter inches.

As can be seen in FIGS. 4 and 5, a pool of solder fills sump 24. By means of the pump 26 and the pipe or conduit 38 associated therewith, solder is pumped from the sump to the bottom of the solder pot 2. As the solder is pumped into solder pot 2, the level of the solder ultimately reaches a rim near the top of the solder pot shown at 50 which is slightly lower than the actual top of the solder pot. As solder is continually pumped into the solder pot, solder overflows at the lip 50 into a channel 52. The channel 52 allows the overflowing solder to spill back into the solder sump 24. This action carries any dross which may have formed on the top of the solder pool off into the sump from which it may be conveniently skimmed, by means not shown, without interfering with the operation of the solder levelling machine, and particularly with the action of the printed circuit board 4 being lowered into and removed from the solder pot 2.

Since the level of the solder pot is higher than the level of the sump to allow the dross to run from the solder pot into the sump, in the event of a machine shutdown, and termination of operation of the pump, solder will tend to be drawn back into the sump by a siphon action and ultimately overflow. To prevent the overflow of solder from the sump when the machine is inoperative, an antisiphon valve 54 is provided in the conduit 38 to break the suction and prevent overflow spillage.

In addition to the self-purging features described above, it may be noted that the solder is pumped from the sump into the solder pot at the bottom of the solder pot. This provides a continuous flow of solder through the solder pot such that the entire pot stays hot at a relatively constant temperature, slightly above the melting temperature of solder. With a static pot, as has been used in the past, the top of the solder tends to become chilled due to the lowering of relatively cool printed circuit boards into the solder. The solder pot of the instant machine, therefore, provides automatic skimming to remove slag, dross, and contaminents at the top of the solder pot and also provides a uniform temperature throughout the depth of the solder pot.

Figure 6:
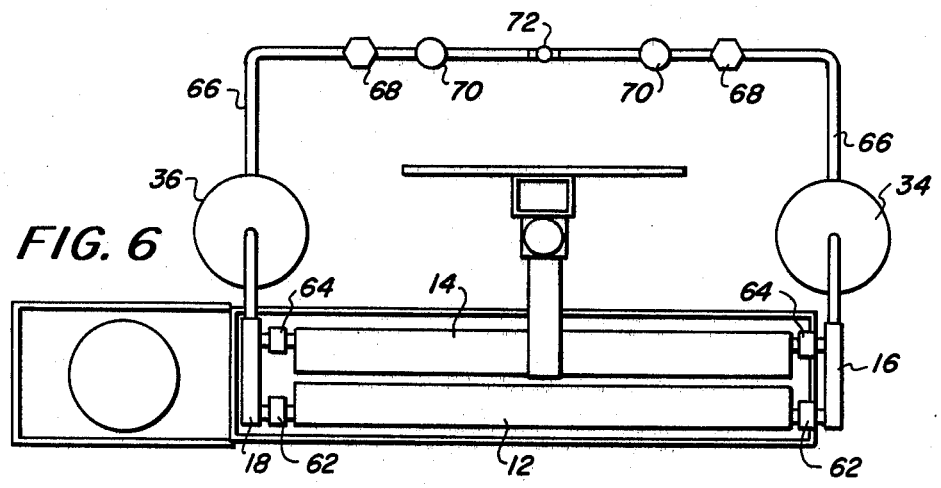
FIG. 6 is a partial schematic diagram of the hot air system of the invention.

FIG. 6 is a partially schematic diagram showing the air knives 12 and 14 between which a printed circuit board passes upon being raised from the molten solder bath and solder pot 2. The air knives provide a blast of air or other hot gas to remove excess solder from the printed circuit board and to clear the molten solder from the through-holes of the circuit board.

In conjunction with FIG. 6, it is useful to consider FIGS. 7, 8, and 9. As before, like parts will be provided with like numbers.

At either end of the air knives 12, 14, are manifolds 16 and 18 through which heated air, under pressure, is introduced into the air knives 12, 14. Each manifold has associated therewith a heater 34, 36 which communicates with the manifold through an inlet hole 60. The manifold allows flow of air to enter the air knives 12, 14 through conduits 62, 64.

The heaters 34 and 36 may be any heater means for storing a quantity of air and heating the air to a suitable temperature, somewhat above the temperature of molten solder.

Air is directed to the heaters 34 and 36 through conduits 66. Pressure regulators 68 are provided in the line together with solenoid valves 70 to turn on and turn off the flow of air from the air supply indicated at 72 to the air knives. In operation, as a circuit board is being removed from the solder bath 2 to pass between the air knives 12 and 14 a blast of heater air or other gas is allowed to flow by means of operation of the solenoids 70 to connect the air supply to the heaters. The solenoids are actuated by connections, not shown, from switches 76, 78 which, in turn, are actuated by movable member 8 as the board is withdrawn from the solder pot. Switch 76 is actuated to turn on the blast of air and switch 78 turns the blast off.

FIG. 8 is a front view of air knife 12. The air knife 12 has a central cavity 70 into which air flows from the manifolds 16, 18. As the air flows under pressure from the heater air supply to the air knife, the air is forced through the slot in the front of the air knife 72 which slot may be approximately 20/1000th of an inch wide. Merely for purpose of reference, the width of the knives may be on the order of 24 inches. This width is not critical, and may be any convenient width desired to handle circuit boards of a desired size. Mounted on the bottom segment of each air knife are five spacers 74, which spacers are approximately 20/1000th of an inch in height. The spacers are somewhat recessed from the aperture of the air knife so that turbulence in the operation area of air knives is eliminated. It has been found, however, that while baffling is not necessary with the double manifold arrangement of the instant device, the spacers do help to provide an even flow of air across the relatively long width of the knives and improve operation of the device. As the knives are heated by the hot air, any temperature variation across the width of the knives may result in a twisting and a distortion of the aperture shape and size. The spacers retain the correct aperture size. It should be further noted, that since no baffling is present within the air knives, a relatively equal pressure should be applied to each of the manifolds 16, 18 by means of the pressure regulator 68 in the air supply lines.

In operation, a printed circuit board 4 is attached to a holding mechanism 6 which is mounted on a movable device 8 which is pneumatically operated to lower the printed circuit board 4 into the solder pot 2 which is filled with molten solder. When the printed circuit board 4 reaches the bottom of the lowering cycle, the board may be stroked, or moved upwardly and downwardly for a short distance while remaining immersed, a variable number of times in order to agitate the flowing solder and to vary the subsequent thickness of the solder which will adhere to the exposed conductors and through-holes of the circuit board. Upon completion of the stroking action, the board is raised between a pair of air knives 12, 14. As the board is passing between the air knives, a blast of hot air or other gas (such as an inert gas to reduce the occurrence of dross and slag on top of the solder pot) impinges upon the both sides of the circuit board to remove the excess solder from the board and to clear the molten solder from the through-holes which are provided in the circuit board. The air flow continues until the board has traveled beyond the limit of the air knives. The air knives may be actuated at an appropriate time by means of solenoid valves 70 which connect the air knives, through a heating device, to an air supply. (It should be noted, that prior to immersing the board in the molten solder, the board is suitable prepared for soldering by washing or scrubbing, possibly etching with a mild acid solution, and thoroughly fluxing such that solder will be more readily accepted). The pressure of the gas may be varied to vary the thickness of the solder remaining on the board. The thickness of the solder may also be varied by varying the rate of withdrawal of the board from the solder pot.

Continually, during the process, a supply of molten solder is provided from a solder sump 24 by means of a pump 26 through a conduit 38 to the bottom of the solder pot. Since a fresh supply of molten solder is continually provided at the bottom of the solder pot, the solder continually flows upwardly through the solder pot to aid in maintaining a uniform temperature throughout the solder pot. The excess solder from the pumping action overflows at the top of the solder pot and is directed back to the sump together with slag dross, and impurities. The slag, dross and impurities may be removed from the sump by appropriate skimming means. As previously noted, an antisiphon valve 54 may be provided in the conduit 38 to prevent siphoning action which may overflow the solder sump in the event the machine is shut down while the solder is still in its molten state.

After the printed circuit board has been coated with solder and leveled it may be cleaned and treated in an appropriate manner to prepare the board for application of components thereto.

While the invention has been described with respect to a specific embodiment thereof, it is understood that alternatives may occur to those skilled in the art. The invention, therefore, should be limited only by the scope of the claims appended hereto.

What is claimed is:

1. Apparatus for lowering a printed circuit board into a molten solder bath, imparting reciprocating vertical motion to the printed circuit board while immersed in the solder bath whereby the thickness of the solder bath coating formed on the printed circuit board is controlled, and then withdrawing the printed circuit board from the solder bath comprising:

a. a single gas cylinder having a pressure piston slidably mounted in said cylinder and secured to a vertically extending piston rod, said printed circuit board being operatively associated with said piston rod,
b. a source of air,
c. a hand valve connected to said source of air for manually initiating said verticle reciprocating motion by allowing air from said source to flow to a first movable valve positionable between first and second positions said first movable valve being initially biased in said first position and moved to said second position by said air flow,
d. a master valve responsive to an input air flow and adapted to direct the input air flow to one of first and second outlets, said first and second outlets being operatively coupled to the top and bottom, respectively, of said gas cylinder, said master valve being responsive to the movement of said first movable valve to said second position to direct air flow to said first outlet and to the top of said piston while exhausting air from the bottom thereof to cause the piston to move vertically downward,
e. a second movable valve coupled to said master valve and initially biased in a first position and movable to a second position when air flow is directed thereto;
f. a first air switch coupled between said air source and said second movable valve, means fixed to said piston for operating said air switch to cause said second movable valve to move to said second position when said piston is in a lower position, said master valve being responsive to the movement of said second valve to said second position to direct air flow to said second outlet and to the bottom of said piston via said second outlet while air is exhausted from the top thereof to cause the piston to move vertically upward;
g. a second air switch coupled between said hand valve and said first movable valve, means fixed to said piston for operating said second air switch to cause said first movable valve to move to said second position from said first position when said piston is raised to a position nearing the withdrawal of said printed circuit board to reinitiate the vertical downward motion of said piston, and said second air switch being inoperative to prevent withdrawal of said printed circuit board from said bath when said hand valve is not manually activated; and
h. means for directing heated air from opposite directions onto opposite surfaces of said printed circuit board as said printed circuit board is withdrawn from said solder bath.

* * * * *